United States Patent [19]
Fujii

[11] Patent Number: 5,442,223
[45] Date of Patent: Aug. 15, 1995

[54] SEMICONDUCTOR DEVICE WITH STRESS RELIEF

[75] Inventor: Tetsuo Fujii, Toyohashi, Japan

[73] Assignee: Nippondenso Co., Ltd., Kariya, Japan

[21] Appl. No.: 225,924

[22] Filed: Apr. 11, 1994

Related U.S. Application Data

[63] Continuation of Ser. No. 774,982, Oct. 15, 1991, abandoned.

[30] Foreign Application Priority Data

Oct. 17, 1990 [JP] Japan .................. 2-280507

[51] Int. Cl.⁶ .................. H01L 27/06; H01L 29/06
[52] U.S. Cl. .................. 257/506; 257/508; 257/640; 257/649
[58] Field of Search .............. 257/506, 517, 518, 520, 257/524, 525, 18, 19, 353, 354, 639–641, 649, 760, 508

[56] References Cited

U.S. PATENT DOCUMENTS

| | | | |
|---|---|---|---|
| 3,431,468 | 3/1969 | Hoffman | 257/526 |
| 4,435,446 | 3/1984 | Marston et al. | 257/506 |
| 4,506,434 | 3/1985 | Ogawa et al. | 257/506 |
| 4,571,819 | 2/1986 | Rogers et al. | 257/510 |
| 4,621,414 | 11/1986 | Iranmanesh | 257/506 |
| 4,764,248 | 8/1988 | Bhattacherjee et al. | 156/643 |
| 4,849,370 | 7/1989 | Spratt et al. | 437/71 |
| 4,952,524 | 8/1990 | Lee et al. | 437/67 |
| 4,963,505 | 10/1990 | Fujii et al. | 257/338 |
| 4,982,263 | 1/1991 | Spratt et al. | 257/524 |

FOREIGN PATENT DOCUMENTS

| | | |
|---|---|---|
| 0149752 | 9/1982 | Japan . |
| 0213272 | 9/1987 | Japan . |
| 62-214638 | 9/1987 | Japan . |
| 63-033839 | 2/1988 | Japan . |
| 0164344 | 7/1988 | Japan . |
| 0112746 | 5/1989 | Japan . |
| 0144665 | 6/1989 | Japan . |
| 0181438 | 7/1989 | Japan . |
| 0225349 | 9/1989 | Japan . |
| 0225353 | 9/1989 | Japan . |
| 0226166 | 9/1989 | Japan . |
| 0251635 | 10/1989 | Japan . |
| 0302740 | 12/1989 | Japan . |
| 0322739 | 12/1989 | Japan . |
| 0148855 | 6/1990 | Japan . |
| 3155650 | 7/1991 | Japan . |
| 0044752 | 1/1992 | Japan . |

OTHER PUBLICATIONS

"Denki Zairyo", and partial translation, Mar. 20, 1980.
Proceedings of ISPSD '88 (Aug., 1988).

Primary Examiner—Robert P. Limanek
Assistant Examiner—David B. Hardy
Attorney, Agent, or Firm—Cushman, Darby & Cushman

[57] ABSTRACT

An SOI-type semiconductor device in which electrical elements formed on one semiconductor substrate are isolated from each other by an insulating film and a shield layer, to ensure a stable operation of the electrical elements against electrical noise etc., and at the same time, a stress relief film is formed between the insulating film and the shield layer to ensure that an SOI layer is stabilized by being free from crystal defects. A process for producing same is also disclosed.

12 Claims, 7 Drawing Sheets

SEMICONDUCTOR DEVICE WITH STRESS RELIEF

This is a continuation of application Ser. No. 07/774,982, filed on Oct. 15, 1991, which was abandoned.

BACKGROUND OF THE INVENTION

1. Field of the Invention

The present invention relates to a semiconductor device and a process for producing the same. The present invention is used, for example, for a semiconductor device comprising a plurality of elements formed on one substrate, the elements being separated from each other for insulation.

2. Description of the Related Art

The applicant of the present invention has previously filed a patent application, i.e., U.S. patent application Ser. No. 07/597,698, directed to a semiconductor device comprising a plurality of elements formed on one substrate, the elements being separated from each other for insulation.

This semiconductor device is an apparatus developed for preventing the occurrence of noise from adjacent semiconductor elements formed on the substrate. In this device, a conductive layer is formed so as to surround an element forming region where a semiconductor element comprising an SOI (silicon on insulator) device is formed, and an $SiO_2$ film is formed as an insulating film around the conductive layer to utilize the conductive layer as an electric shielding layer.

In the above-described U.S. patent application Ser. No. 07/597,698, however, it has been found that, since the $SiO_2$ film is formed under the SOI layer, when a strain attributable to the thermal expansion coefficient difference occurs within the SOI layer, the strain brings about a crystal defect due to a reduction in the film thickness now in use.

A multilayer interconnection is one means used for solving this problem. In this means, to combat a tensile stress exerted by an interlayer-insulation film ($SiO_2$ film) formed for insulating the (n)th layer from the (n+1)th layer, an $Si_3N_4$ film is formed on or under the interlayer-insulation film to exert a compressive stress and thereby relieve the tensile stress.

In the use of the above-described technical means for solving the above-described problem it has been found that, when the $Si_3N_4$ film is formed on the $SiO_2$ film, since the element forming region and the $Si_3N_4$ film are in direct contact with each other, the compressive stress of the $Si_3N_4$ film acts on the element forming region, and thus a crystal defect occurs within the element forming region.

SUMMARY OF THE INVENTION

Accordingly, the present invention has been created with a view to solving the above-described problem, and an object of the present invention is to provide a semiconductor device capable of stabilizing the electrical characteristics of a semiconductor element without causing a crystal defect within the element forming region, and to provide a process for producing the same.

To attain the above-described object, a first aspect of the present invention is directed to a semiconductor device wherein a semiconductor element is formed in a predetermined region surrounded by an insulating film, comprising: an electric shielding layer formed so as to surround said insulating film, and a stress relief film for relieving the thermal stress of said insulating film, the stress relief film being formed between the insulating film underlying the predetermined region and the electric shielding layer.

A second aspect of the present invention is directed to a semiconductor device comprising: a substrate; a polycrystalline film formed at least on the substrate; an element forming layer formed at least on the polycrystalline film, and at the same time, having a semiconductor element formed in a predetermined region thereof; a polycrystalline layer formed from a main surface of the element forming layer so as to reach the polycrystalline film and to surround the predetermined region in cooperation with the polycrystalline film; a stress relief film formed at least on the polycrystalline film, other than a portion where the polycrystalline layer is formed; an insulating film formed within the region surrounded by the polycrystalline layer along the stress relief film and the polycrystalline layer; and an electrode for applying a potential to the polycrystalline film and the polycrystalline layer to thereby form an electric shielding layer.

A third aspect of the present invention is directed to a process for producing a semiconductor device, comprising: a first step of forming a wafer comprising a polycrystalline film, a nitride film, an insulating film and an element forming layer, in that order, at least on a substrate; a second step of removing a predetermined portion by etching from a main surface of the element forming layer so as to reach the nitride film to form a trench portion in such a manner that a predetermined region of the element forming layer is surrounded by said nitride film and the trench portion; a third step of forming an oxide film at the trench portion through a thermal oxidation treatment; a fourth step of removing the nitride film by etching until the trench portion reaches the polycrystalline film formed under the trench portion; a fifth step of burying a polycrystalline layer in the trench portion subjected to the fourth step; and a sixth step of forming a semiconductor element within the predetermined region surrounded by the insulating film and the oxide film, and at the same time, forming an electrode portion on the surface of the polycrystalline layer.

A fourth aspect of the present invention is directed to a semiconductor device comprising: a substrate; a first monocrystalline semiconductor layer formed at least on the substrate; an electrode layer formed under the substrate; a second monocrystalline semiconductor layer formed on a predetermined portion of the first monocrystalline semiconductor layer, and at the same time, having a power device formed therein; a first insulating film formed at least on the first monocrystalline semiconductor layer other than the predetermined portion; a polycrystalline film formed on the first insulating film, the polycrystalline film at an end face thereof near the second monocrystalline semiconductor comprising an oxide film; an element forming layer formed at least on the polycrystalline film and having a semiconductor element formed in a predetermined region thereof; a polycrystalline layer formed from a main surface of the element forming layer so as to reach the polycrystalline film and surround the predetermined region in cooperation with the polycrystalline film; a stress relief film formed at least on the polycrystalline film other than a portion where the polycrystalline layer is formed; a second insulating film formed within a region surrounded by the stress relief film and the polycrystalline layer along the stress relief film and the polycrystalline layer; and an electrode portion for applying a potential to the polycrystalline film and the polycrystalline layer to thereby form an electric shielding layer.

A fifth aspect of the present invention is directed to a process for producing a semiconductor device, comprising: a first step of forming a wafer comprising a first monocrystalline layer, a first insulating film, a polycrystalline film, a nitride film, a second insulating film and an element forming layer, in that order, on the surface of a substrate; a second step of removing a predetermined portion by etching from a main surface of the element forming layer so as to reach the nitride film to form a trench portion and a device forming region in such a manner that a predetermined region of the element forming layer is surrounded by the nitride film and the trench portion; a third step of removing the nitride film and the polycrystalline film underlying the device forming region and then conducting a thermal oxidation treatment to form an oxide film on the end face of the polycrystalline film facing the trench portion and the device forming region; a fourth step of removing the film formed on the polycrystalline film by etching until the trench portion reaches the underlying polycrystalline film; a fifth step of removing the film formed on the first monocrystalline semiconductor layer by etching so as to reach the first monocrystalline semiconductor layer underlying the device forming region and then forming a second monocrystalline semiconductor layer on the first monocrystalline semiconductor layer; a sixth step of forming a polycrystalline layer within the trench portion; and a seventh step of forming an electrode layer on the reverse side of the substrate, forming a semiconductor element in the predetermined region surrounded by the second insulating film and the oxide film, and forming a power device in the device forming region.

According to the first aspect of the present invention, the electric shielding layer is formed so as to surround the insulating film surrounding the predetermined region.

Therefore, since the periphery of a predetermined region where a semiconductor element is formed is surrounded by an insulating film and an electric shielding layer, this region can be electrically isolated from the other regions. Further, the stress relief film formed between the insulating film underlying the predetermined region and the above-described electric shielding layer relieves the thermal stress of the insulating film.

Further, according to a second aspect of the present invention, the polycrystalline layer is formed from the main surface of the element forming layer so as to reach the polycrystalline film, and the insulating film is formed within a region surrounded by the stress relief film and the polycrystalline layer along the stress relief film and the polycrystalline layer.

Therefore, the conductive polycrystalline layer and polycrystalline film surrounding the predetermined region can serve as an electric shielding layer. Further, since the second insulating film is formed along the stress relief film and the polycrystalline layer, this region can be electrically insulated from the other regions.

According to a third aspect of the present invention, in the second step, a predetermined portion is removed by etching from the main surface of the element forming layer so as to reach the nitride film to form a trench portion, and in the third step, a thermal oxidation treatment is conducted to form an oxide film at the trench portion. Further, in the fifth step, a polycrystalline layer is buried in the trench portion subjected to the fourth step.

Therefore, when an oxide film is formed at the trench portion, since the underlying layer of the trench portion comprises a nitride film due to the second step, the polycrystalline film underlying the nitride film is not oxidized even by the thermal oxidation treatment, which enables only the periphery of the trench portion to be oxidized.

According to the fourth aspect of the present invention, the predetermined region where a semiconductor element is formed is formed so as to be surrounded by the second insulating film, which is formed along the stress relief film and the polycrystalline layer. Further, the polycrystalline film at an end face thereof near the second monocrystalline semiconductor layer comprises an oxide film.

Therefore, the conductive polycrystalline layer and the conductive polycrystalline film surrounding the predetermined region can serve as an electric shielding layer. Further, since the second insulating film is formed along the stress relief film and the polycrystalline layer, the above-described predetermined region can be electrically insulated from the other regions, for example, a power device forming region. Further, since an oxide film is formed on the polycrystalline film at an end face thereof near the second monocrystalline semiconductor layer, the electric shielding layer cannot influence the power device forming region.

According to the fifth aspect of the present invention, in the second step, a predetermined portion is removed by etching from the main surface of the element forming layer so as to reach the nitride film to form a trench portion and a device forming region in such a manner that a predetermined region of the element forming layer is surrounded by the nitride film and the trench portion.

In the third step, an thermal oxidation treatment is conducted to form an oxide film on the end face of the polycrystalline film facing the trench portion and the device forming region. In the fourth step, the film formed on the polycrystalline film is removed by etching until the trench portion reaches the underlying polycrystalline film. In the seventh step, an electrode layer is formed on the reverse side of the substrate, a semiconductor element is formed in the predetermined region surrounded by the second insulating film and the oxide film, and a power device is formed in the device forming region.

Therefore, when an oxide film is formed in the trench portion, since the underlying layer of the trench portion comprises a nitride film formed by the second step, the polycrystalline film underlying the nitride film is not oxidized even by the thermal oxidation treatment, which allows only the periphery of the trench portion to be oxidized. Further, since an oxide film is formed on the polycrystalline film at its end face near the second monocrystalline semiconductor layer, the oxide film can prevent the electric shielding layer from having an influence on the power device forming region.

According to the second through fifth aspects of the present inventions described above, the stress relief film or nitride film formed on the polycrystalline film exclusive of the portion in which an polycrystalline layer is formed exerts a compressive stress on the element forming layer. Further, the insulating film formed within a region surrounded by the stress relief film or nitride film and the polycrystalline layer along the polycrystalline layer and the stress relief film or nitride film exerts a tensile stress on the element forming layer.

As described above, the first aspect of the present invention exhibits an excellent effect such that, since the predetermined region in which a semiconductor element is formed is electrically insulated from the other region, it is possible to stabilize the electrical characteristics of the semiconductor element. Further, since the thermal stress of the insulating film is relieved by the stress relief film, it is possible to attain an excellent effect such that a semiconductor device can be formed within a predetermined region without causing a crystal defect.

According to the second aspect of the present invention, since the predetermined region in which a semiconductor element is formed can be electrically insulated from the other regions, it is possible to attain an excellent effect such that the electrical characteristics of the semiconductor element can be stabilized.

According to the third aspect of the present invention, since the nitride film formed for the purpose of relieving the tensile stress caused by the insulating film is effectively utilized during the manufacturing process, it is possible to attain an excellent effect such that an semiconductor device can be produced with a minimum increase in the number of steps for forming an electric shielding layer, an insulating film and a nitride film within the semiconductor device.

According to the fourth aspect of the present invention, since the predetermined region in which a semiconductor element is formed can be electrically insulated from the power device forming region in which a power device is formed, it is possible to attain such an excellent effect that the stabilization of the electrical characteristics of the semiconductor element provided in each region can be realized. Further, since the influence of the electric shielding layer on the power device forming region is prevented by an oxide film formed on the polycrystalline film at its end face near the second monocrystalline semiconductor layer, it is possible to attain such an excellent effect that the stabilization of the electrical characteristics can be realized also on the power device formed in the power device forming region.

According to the fifth aspect of the present invention, since the nitride film formed for the purpose of relieving the tensile stress caused by the second insulating film is effectively utilized during the manufacturing process, it is possible to attain such an excellent effect that an semiconductor device can be produced with a minimized increase in the number of steps for forming an electric shielding layer, an insulating film and a nitride film within the semiconductor device. Further, since the influence of the electric shielding layer on the power device forming region is prevented by an oxide film formed on the polycrystalline film at its end face near the second monocrystalline semiconductor layer, it is possible to attain an excellent effect such that the electrical characteristics can be stabilized for the power device formed in the power device forming region.

Further, according to the present invention, since the stress relief film or the nitride film exerts a compressive stress on the element forming layer and the second insulating film exerts a tensile stress on the element forming layer, it is possible to attain an excellent effect such that the inside of the element forming layer can be maintained in such a state that the stress thereon is relieved.

DESCRIPTION OF THE PREFERRED EMBODIMENTS

The present invention will now be described by way of examples with reference to the attached drawings.

EXAMPLE 1

Figure 1:
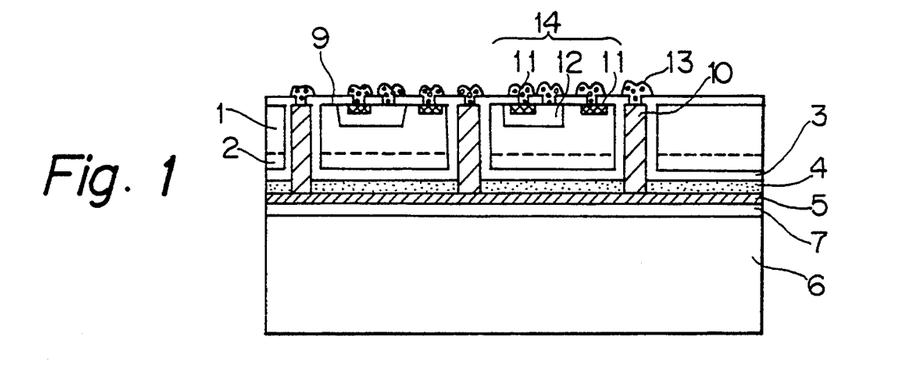
FIG. 1 is a cross-sectional view of a semiconductor device according to a first embodiment of the present invention.

FIG. 1 is a cross-sectional view of the first embodiment of the semiconductor device according to the present invention.

In FIG. 1, an SiO$_2$ film 7 is formed on a monocrystalline Si substrate 6, and a polycrystalline silicon film or poly-Si film 5 is formed thereon.

Further, a polycrystalline silicon layer or a poly-Si layer 10 is formed on the poly-Si film 5 at a predetermined portion thereof, and an Si$_3$N$_4$ film 4 is formed as a stress relief film on the other portion thereof.

An SiO$_2$ film 3 is formed on the Si$_3$N$_4$ film 4, and an N+ epitaxial layer 2 as an element forming layer and an N− monocrystalline Si substrate 1 are successively deposited thereon. A bipolar transistor 14 is formed in each SOI region.

In this case, since the conductive poly-Si covers the side portion and the bottom portion of each SOI region, the application of a potential to the poly-Si through an Al electrode 13 enables the poly-Si film 5 and the poly-Si layer 10 to serve as an electric shielding layer.

Thus, according to the above-described constitution, the individual SOI regions are separated for insulation with an oxide film 9 as an insulating film therebetween, and the poly-Si film serves as an electric shielding layer, so that each SOI region can be electrically stabilized. The above-described SiO$_2$ film 3 and the oxide film 9 serve as an insulating film.

Further, an SiO$_2$ film 3 and an Si$_3$N$_4$ film 4 are formed near the bond interface between the Si substrate 1 and the Si substrate 6. The SiO$_2$ film 3 and the Si$_3$N$_4$ film 4 serves to relieve the stress caused within the SOI layer. Specifically, the SiO$_2$ film 3 exerts a tensile stress on the SOI layer, and the Si$_3$N$_4$ film 4 exerts a compressive stress on the SOI layer. As a result, in a region where an SOI layer is formed, the SOI can be formed in such a state that the stress is relieved.

Further, since the poly-Si film 5 underlies the Si$_3$N$_4$ film 4, even when a crystal defect occurs within the poly-Si film 5 due to the compressive stress of the Si$_3$N$_4$ film 4, no problem occurs because the poly-Si film 5 serves merely as an electric shielding layer electric current passes.

The process for producing the semiconductor device shown in FIG. 1 will now be described with reference to FIGS. 2(a) and (b) and FIGS. 3 to 8. FIGS. 3 to 8 are cross-sectional views of a semiconductor device shown in the order of the steps of producing the semiconductor device.

Figure 2A:
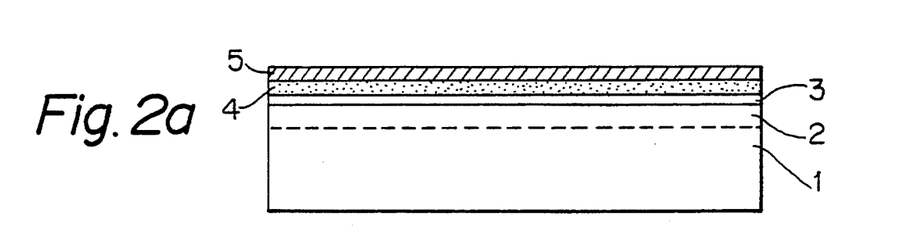
FIG. 2(a) and FIG. 2(b) are each a cross-sectional view of a semiconductor device in the step of forming a substrate in the first embodiment.
Figure 2B:
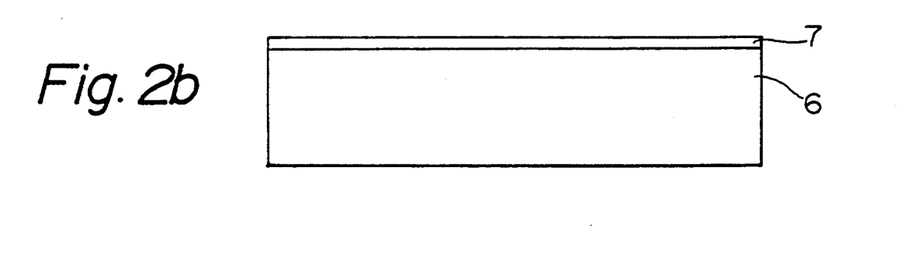

Step of Forming Substrate (FIGS. 2(a), 2(b))

As shown in FIG. 2(a) an N+ epitaxial layer 2 having a predetermined thickness is formed by N+ epitaxial growth on an N−-type monocrystalline Si substrate 1 having a (100) face orientation and an electric resistivity of 3 to 10 Ω.cm.

It is also possible to diffuse an impurity, such as As or Sb, instead of the utilization of the N+ epitaxial growth.

Subsequently, a 0.2 to 2 μm-thick SiO$_2$ film 3 is formed on the N+ epitaxial layer 2, either by thermal oxidation at 900° to 1100° C. or by chemical vapor deposition (CVD), and a 0.1 to 0.3 μm-thick Si$_3$N$_4$ film 4 is deposited on the SiO$_2$ film 3 by the low pressure-CVD (LPCVD) process.

Then, a 1 to 10 μm-thick poly-Si film 5 doped with impurities, such as As and P, in a high concentration is deposited on the Si$_3$N$_4$ film 4 by the LPCVD process, and the surface of the poly-Si film 5 is mirror polished by a chemical polishing process until the surface smoothness becomes 30 Å or less (preferably 10 Å or less).

Thus, a substrate having a cross section shown in FIG. 2(a) is obtained through the above-described manufacturing procedure. In this first embodiment, use was made of a poly-Si film doped with impurities such as As and P. When the poly-Si film is thin, it is possible to conduct the deposition of an undoped poly-Si film followed by the formation of the poly-Si film 5 by the diffusion process or ion implantation process.

Separately from the above-described Si substrate 1, the following Si substrate 6 is formed, as shown in FIG. 2(b).

Specifically, an N− monocrystalline Si substrate 6 having a (100) face orientation and an electrical resistivity of 3 to 10 Ω.cm is heat-treated at 900° to 1100° C., and a 0.2 to 2 μm-thick SiO$_2$ film 7 is formed on the Si substrate 6. This procedure yields a substrate having a cross section shown in FIG. 2(b).

Figure 3:
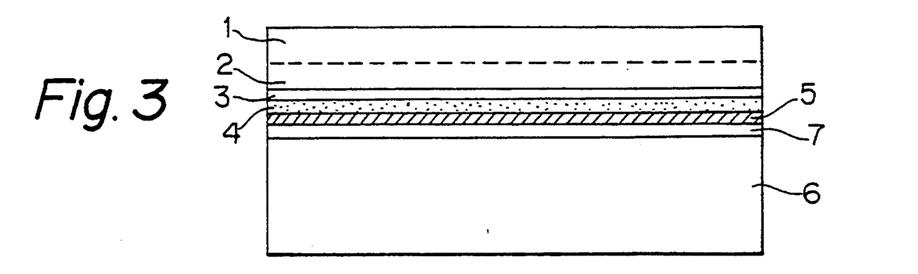
FIG. 3 is a cross-sectional view of a semiconductor device in the lamination step in the first embodiment.

Lamination Step (FIG. 3)

The surface of the poly-Si film 5 of the Si substrate 1 shown in FIG. 2(a) and the surface of the SiO$_2$ film 7 of the Si substrate 6 shown in FIG. 2(b) are subjected to a hydrophilic treatment by using a mixed solution comprising aqueous hydrogen peroxide (H$_2$O$_2$) and sulfuric acid (H$_2$SO$_4$), dehydrated, dried, and then laminated to each other. The laminate is subjected to a bonding of the wafers in nitrogen at 600° to 1100° C. for 1 to 2 hr.

Subsequently, the Si substrate 1 is mirror polished to a desired thickness. In this case, for example, when a bipolar transistor is formed on the substrate, the Si substrate 1 is mirror polished to a thickness of about 3 to 10 μm, but when a MOS transistor is formed, the Si substrate 1 is mirror polished to a thickness of 5 μm or less.

Thus, a structure having a cross section shown in FIG. 3 is obtained through the above-described manufacturing procedure, i.e., an SOI layer is formed. The above-described step of forming a substrate and the step of lamination correspond to the first step.

Figure 4:
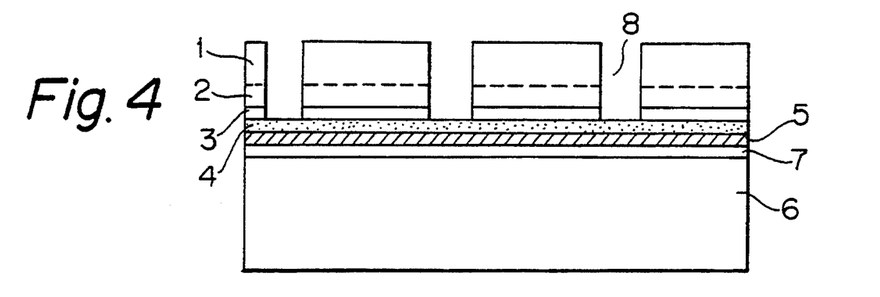
FIG. 4 is a cross-sectional view of a semiconductor device in the step of forming a trench portion in the first embodiment.

Step of Forming Trench Portion (FIG. 4)

A resist is coated in a predetermined pattern on the Si substrate 1. The Si substrate 1 at portions thereof not coated with the resist, the N+ epitaxial layer 2, and the SiO$_2$ film 3 are removed by dry etching or the like to form a trench portion 8, thereby forming a structure having a cross section as shown in FIG. 4. The above-described step of forming a trench portion corresponds to the second step.

Figure 5:
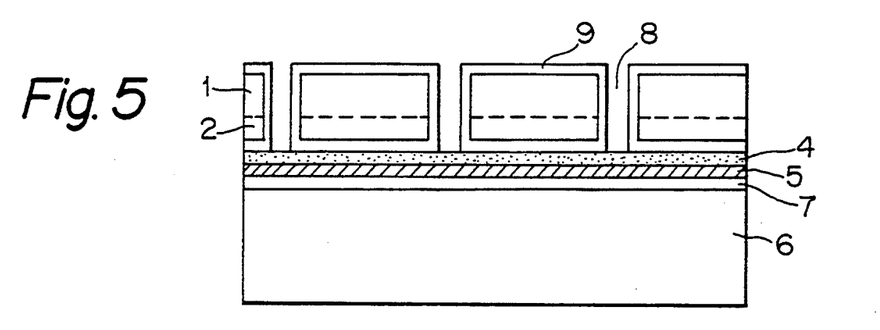
FIG. 5 is a cross-sectional view of a semiconductor device in the thermal oxidation step in the first embodiment.

Step of Thermal Oxidation Treatment (FIG. 5)

Then, thermal oxidation is conducted at 900° to 1100° C. to form an oxide film (SiO$_2$ film) 9 having a thickness of 0.1 to 1 μm, and a structure having a cross section shown in FIG. 5 is obtained.

In this case, since the poly-Si film 5 is formed under the Si$_3$N$_4$ film 4, the Si$_3$N$_4$ film 4 serves as a mask, so that the poly-Si film 5 is not oxidized. The above-described step of thermal oxidation corresponds to the third step.

Figure 6:
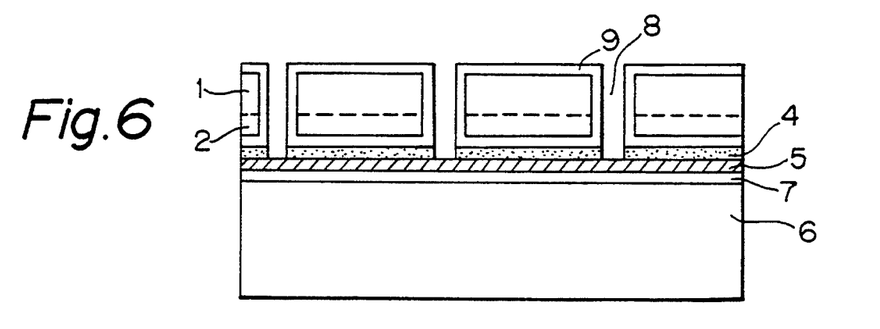
FIG. 6 is a cross-sectional view of a semiconductor device in the step of removing silicon nitride in the first embodiment.

Step of Removing Silicon Nitride (FIG. 6)

Then, as shown in the cross-sectional view of FIG. 6, the Si$_3$N$_4$ film 4 underlying the trench portion 8 is removed by plasma etching or etching with hot phosphoric acid. The above-described step of removing silicon nitride corresponds to the fourth step.

Figure 7:
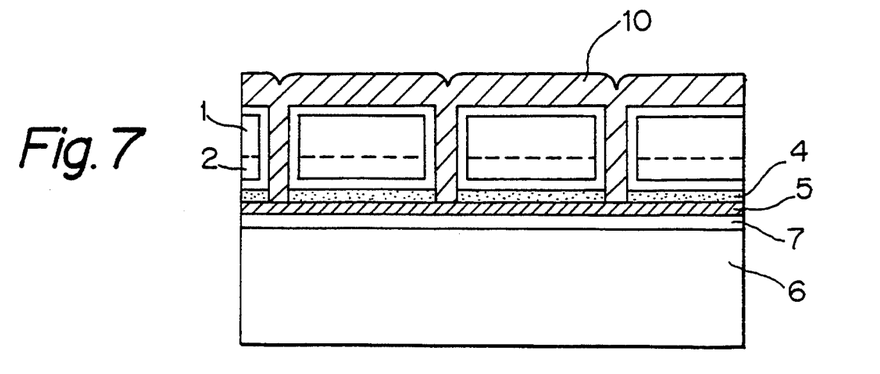
FIG. 7 is a cross-sectional view of a semiconductor device in the burying step in the first embodiment.

Burying Step (FIG. 7)

Then, as shown in FIG. 7, a poly-Si layer 10 is deposited all over the surface of the structure by the LPCVD process until the poly-Si layer 10 fills up the trench portion 8. The above-described burying step corresponds to the fifth step.

Figure 8:
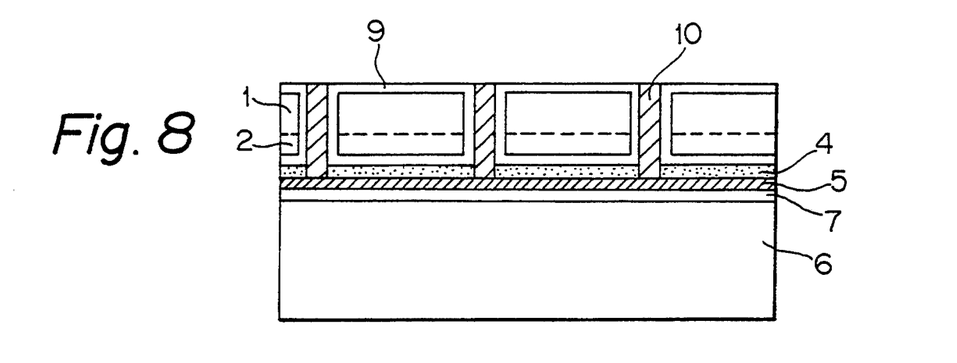
FIG. 8 is a cross-sectional view of a semiconductor device in the leveling step in the first embodiment.

Leveling Step (FIG. 8)

Then, as shown in FIG. 8, the poly-Si layer 10 deposited on the oxide film 9 is leveled or flattened by a selective polishing. This causes the poly-Si layer 10 to remain only in the trench portion 8.

Step of Forming an Element (FIG. 1)

Then, as shown in FIG. 1, an N+-diffusion layer, 11, a p-type diffusion layer 12 and aluminum electrode 13 are provided in each SOI region, by a known semiconductor fabrication technique, to form a bipolar transistor 14. The above-described leveling step and the step of forming an element correspond to the fifth step.

EXAMPLE 2

The second embodiment will now be described. In the second embodiment, a description will be given of a semiconductor device wherein an SOI device and a power device are integrally formed.

Figure 9:
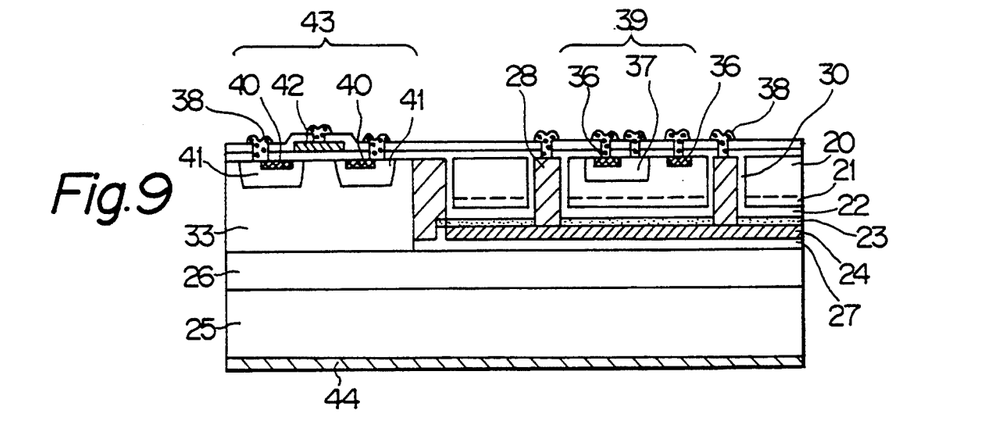
FIG. 9 is a cross-sectional view of a semiconductor device according to a second embodiment of the present invention.

FIG. 9 is a cross-sectional view of a second embodiment of the semiconductor device of the present invention.

In FIG. 9, an N$^-$ epitaxial layer 26 corresponding to a first monocrystalline semiconductor layer is formed on the surface of a Si substrate 25, and a drain electrode 44 corresponding to an electrode layer is formed on the reverse side of the Si substrate 25.

Further, an N$^-$ epitaxial layer 33 corresponding to a second monocrystalline semiconductor is formed on the film at a predetermined portion thereof, and an SiO$_2$ film 27 corresponding to a first insulating film is formed on a portion other than the predetermined portion. A power MOS transistor 43 is formed in the N$^-$ epitaxial layer 33.

A poly-Si film 24 corresponding to a polycrystalline film is formed on the SiO$_2$ film 27, a poly-Si layer 28 corresponding to a polycrystalline layer is formed on the film at a predetermined portion thereof, and an Si$_3$N$_4$ film 23 corresponding to a nitride film is formed on a portion other than the predetermined portion.

An SiO$_2$ film 22 is formed on the Si$_3$N$_4$ film 23, and an N+ epitaxial layer 21 as an element forming layer and an N$^-$ type Si substrate 20 are successively deposited on the film.

In this case, since the conductive poly-Si film covers the side portion and the bottom portion of each SOI region, the application of a potential to the poly-Si film through an aluminum electrode 38 enables the poly-Si film to serve as an electric shielding layer.

Thus, according to the above-described constitution, the individual SOI regions are separated for insulation with an oxide film 30 and an SiO$_2$ film 22 as an insulating film therebetween, and the poly-Si film serves as an electric shielding layer, so that each SOI region can be electrically stabilized without the influence of large variations in the drain displacement of the Si substrate 25 caused, for example, by the operation of a vertical power MOS transistor. The above-described SiO$_2$ film 22 and oxide film 30 correspond to the second insulating film.

Further, SiO$_2$ films 22, 27 and an Si$_3$N$_4$ film 23 are formed near the bond interface between the Si substrate 20 and the Si substrate 25. The SiO$_2$ films 22, 27 and the Si$_3$N$_4$ film 23 serves to relieve the stress caused within the SOI layer. Specifically, the SiO$_2$ films 22, 27 exert a tensile stress on the SOI layer, and the Si$_3$N$_4$ film 23 exerts a compressive stress on the SOI layer. As a result, in a region where an SOI layer is formed, the SOI can be formed in such a state that the stress is relieved.

The process of manufacturing the semiconductor device shown in FIG. 9 will now be described with reference to FIGS. 10(a) and (b) and FIGS. 11 to 18. FIGS. 11 to 18 are cross-sectional views of a semiconductor device shown in the order of the steps of producing the semiconductor device.

Figure 10A:
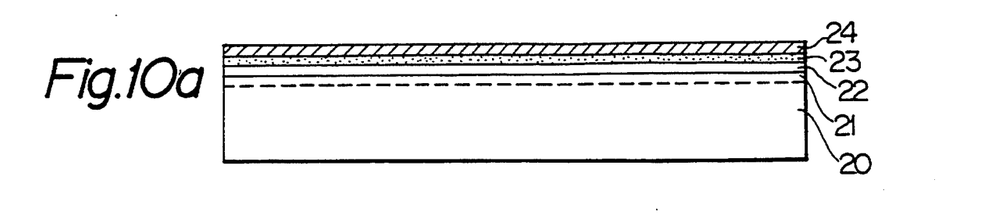
FIG. 10(a) and FIG. 10(b) are each a cross-sectional view of a semiconductor device in the step of forming a substrate in the second embodiment.
Figure 10B:
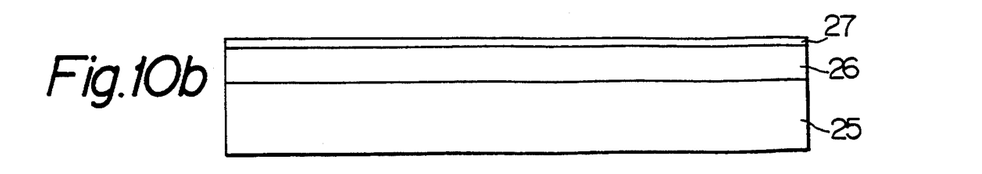

Step of Forming Substrate (FIGS. 10(a), 10(b))

First, a wafer having a cross section as shown in FIG. 10(a) is formed. The description of the process of producing this wafer will be omitted, as it is produced in the same manner as that of the wafer having a cross section as shown in FIG. 2(a).

Separately from the above-described Si substrate 20, the following Si substrate 25 is formed.

Specifically, an N$^-$ epitaxial layer 26 having a predetermined thickness is formed by N$^-$ epitaxial growth on an N+ type Si substrate 25 having (100) face orientation and an electrical resistivity of 3 to 10 Ω.cm. Subsequently, a heat treatment is conducted at 900° to 1100° C., and a 0.2 to 2 μm-thick SiO$_2$ film 27 is formed on the N$^-$ epitaxial layer 26. Thereafter, the resulting structure is subjected to the above-described manufacturing procedure to form a substrate having a cross section shown in FIG. 10(b).

Figure 11:
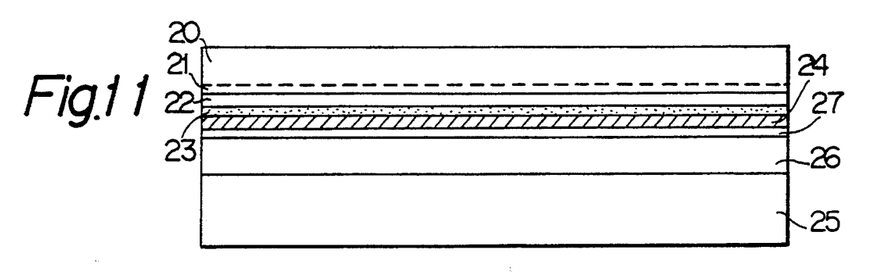
FIG. 11 is a cross-sectional view of a semiconductor device in the lamination step in the second embodiment.

Lamination Step (FIG. 11)

The surface of the poly-Si film 24 of the Si substrate 20 shown in FIG. 10(a) and the surface of the SiO$_2$ film 27 of the Si substrate 25 shown in FIG. 10(b) are subjected to a hydrophilic treatment by using a mixed solution comprising aqueous hydrogen peroxide (H$_2$O$_2$) and sulfuric acid (H$_2$SO$_4$), dehydrated, dried and then laminated to each other. The laminate is then subjected to a Joining of the wafers in nitrogen of 600° to 1100° C. for 1 to 2 hr.

Subsequently, the Si substrate 20 is mirror polished to a desired thickness. In this case, for example, when a bipolar transistor is formed on the substrate, the Si Substrate 20 is mirror polished to a thickness of 3 to 10 μm, and when an MOS transistor is formed, the Si substrate 20 is mirror polished to a thickness of 5 μm or less.

Thus, a structure having a cross section shown in FIG. 11 is obtained through the above-described manufacturing procedure, i.e., an SOI layer is formed. The above-described step of forming a substrate and the lamination step correspond to the first step.

Figure 12:
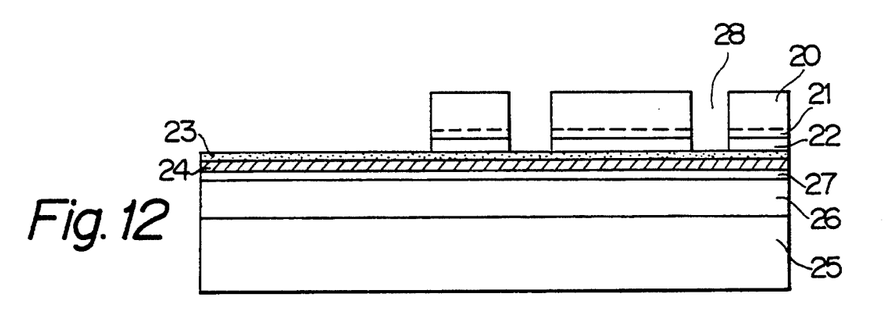
FIG. 12 is a cross-sectional view of a semiconductor device in the step of forming a trench portion in the second embodiment.

Step of Forming Trench Portion (FIG. 12)

A resist having a predetermined pattern is coated on the Si substrate 20. The Si substrate 20 at portions thereof not coated with the resist, the N+ epitaxial layer 21 and the SiO₂ film 22 are removed by dry etching or the like to form a trench portion 28, thereby forming a structure having a cross section as shown in FIG. 12. The above-described step of forming a trench portion corresponds to the second step.

Figure 13:
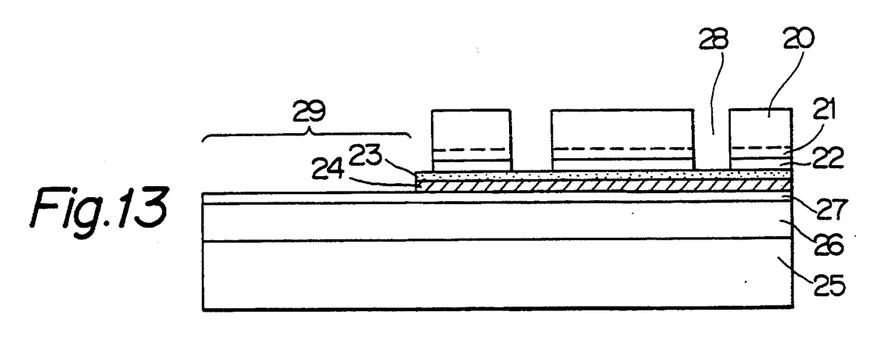
FIG. 13 is a cross-sectional view of a semiconductor device in the step of forming a region in the second embodiment.

Step of Forming a Region (FIG. 13)

Then, as shown in FIG. 13, a resist is coated on the structure except for forming a region 29 where a power MOS transistor is to be formed, and the Si₃N₄ film 4 and the poly-Si 5 in the formed region are removed by etching or the like.

Figure 14:
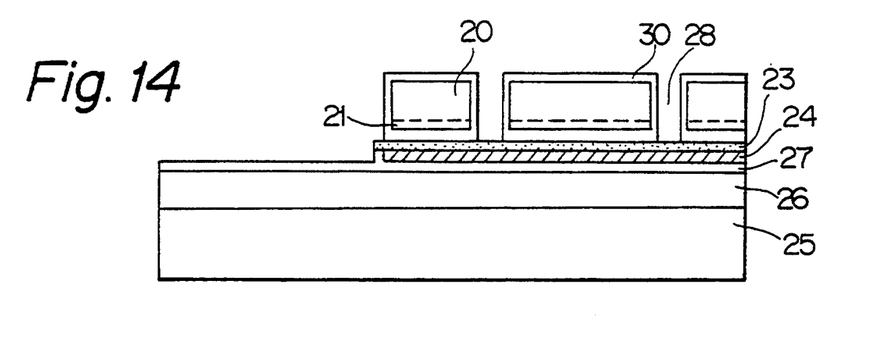
FIG. 14 is a cross-sectional view of a semiconductor device in the thermal oxidation step in the second embodiment.

Step of Thermal Oxidation Treatment (FIG. 14)

Then, thermal oxidation is conducted at 900° to 1100° C. to form an oxide film (SiO₂ film) 30 having a thickness of 0.1 to 1 μm, and thus a structure having a cross section shown in FIG. 14 is obtained.

In this case, an oxide film is formed in the poly-Si film 24 at an end face thereof facing the formed region 29, by the above-described oxidation treatment. The above-described forming step and the thermal oxidation step correspond to the third step.

Figure 15:
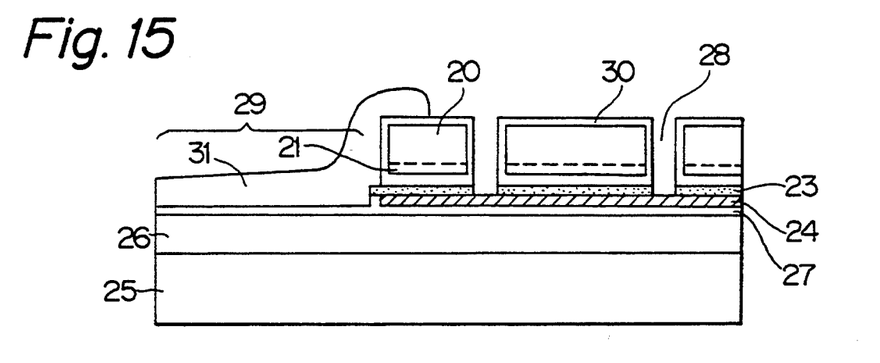
FIG. 15 is a cross-sectional view of a semiconductor device in the step of removing silicon nitride in the second embodiment.

Step of Removing Silicon Nitride (FIG. 15)

Then, as shown in the cross-sectional view of FIG. 15, a resist film 31 is coated on the power MOS transistor forming region 29, and the Si₃N₄ film 23 underlying the trench portion 28 is removed by plasma etching or etching with hot phosphoric acid. The above-described step of removing silicon nitride corresponds to the fourth step.

Figure 16:
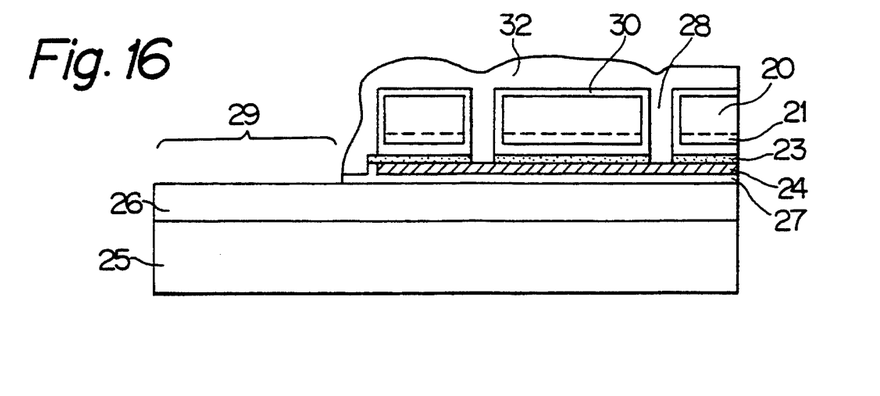
FIG. 16 is a cross-sectional view of a semiconductor device in the step of removing silicon oxide in the second embodiment.

Step of Removing Silicon Oxide (FIG. 16)

Then, as shown in the cross-sectional view of FIG. 16, after the removal of the resist film 31, in order to remove the SiO₂ film 27 in the power MOS transistor forming region 29, a resist film 32 is coated on the portions other than the power MOS transistor forming region, and the SiO₂ film 27 in the power MOS transistor forming region 29 is removed by etching or the like.

The underlying N⁻ epitaxial layer 26 may be removed to a desired thickness.

Figure 17:
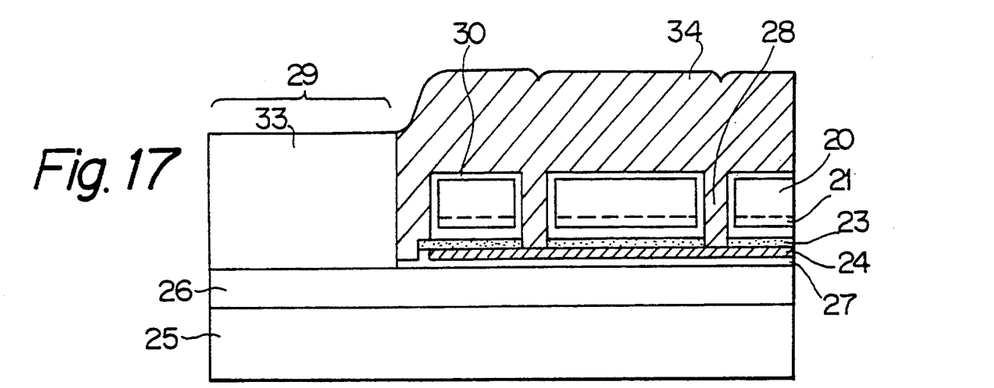
FIG. 17 is a cross-sectional view of a semiconductor device in the burying step in the second embodiment.

Burying Step (FIG. 17)

Then, the resist film 32 of the wafer subjected to the above-described step of removing the silicon oxide is removed, and the structure is then placed in an epitaxial growth apparatus to conduct an epitaxial growth.

Since the power MOS transistor forming region 29 comprises a single crystal, the epitaxial growth causes an N⁻ epitaxial layer 33 comprising a monocrystalline Si to be formed on the surface of the N⁻ epitaxial layer 26.

On the other hand, in portions other than the power MOS transistor forming region 29, since the growth is conducted while using the poly-Si film 24 as the base, a poly-Si layer 34 corresponding to a polycrystalline layer is formed so as to cover the SiO₂ film 27 and the oxide film 30.

Thus, a structure having a cross section as shown in FIG. 17 is obtained through the above-described manufacturing procedure. In the second embodiment, since the resistance value of the poly-Si layer 34 buried in the trench portion 28 is relatively high, the resistance value may be lowered by either previously burying the poly-Si layer having a high concentration in this portion after removing silicon nitride (FIG. 15), or introducing impurities by diffusion or ion implantation after the leveling step, as described later.

The above-described step of removing silicon oxide and the above-described burying step correspond to the fifth step and the sixth step, respectively.

Figure 18:
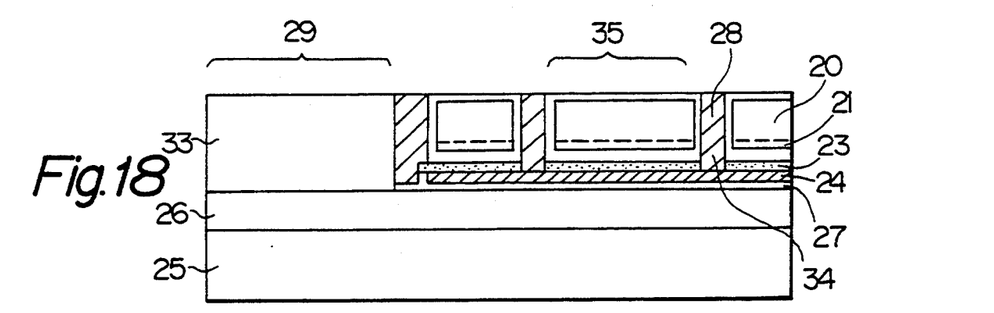
FIG. 18 is a cross-sectional view of a semiconductor device in the leveling step in the second embodiment.

Leveling Step (FIG. 18)

Then, as shown in FIG. 18 the poly-Si layer 34 deposited on the oxide film 30 and the N-epitaxial layer 33 comprising monocrystalline Si are leveled by selective polishing. This causes the poly-Si layer 34 to remain only in the trench portion 28.

Step of Forming Element (FIG. 9)

Then, an N⁺-type diffusion layer 36, a p-type diffusion layer 37 and an aluminum electrode 38 are provided in the forming region 35 shown in FIG. 18, by a known semiconductor fabrication technique, to form a bipolar transistor 39.

Further, an N⁺-type diffusion layer 40, a p-type diffusion layer 41, an aluminum electrode 38 and a gate electrode 42 are provided in the forming region 29 shown in FIG. 18, by a known semiconductor fabrication technique, and a drain electrode 44 is formed on the reverse side of the Si substrate 25 to form a power MOS transistor 43. The above-described leveling step and the step of forming an element correspond to the seventh step.

It is possible to form, besides the above-described bipolar transistor, a semiconductor element such as a CMOS transistor, and a combination of the bipolar transistor with the CMOS transistor.

Thus, a semiconductor device having a cross section as shown in FIG. 9 according to the second embodiment is produced through the above-described manufacturing procedure.

A process for producing a semiconductor device which enables the stress within the SOI layer to be further relieved, i.e., enables one of the objects of the present invention to be attained, will now be described.

Since this process can be applied to any of the first and second embodiments, a description will now be given only of the first embodiment.

Figure 19:
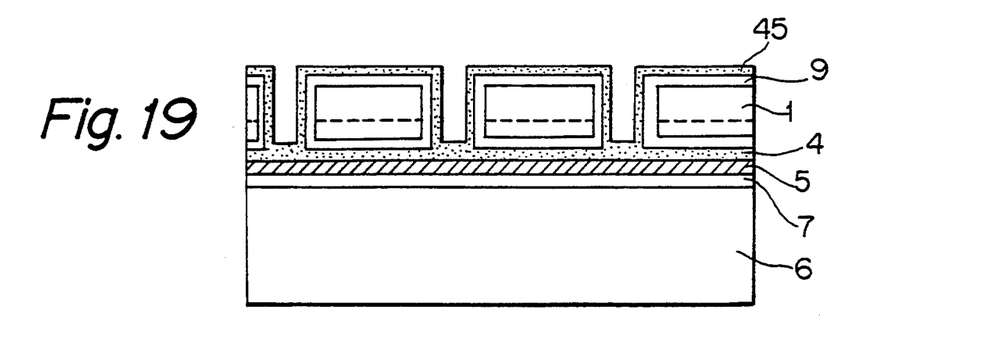
FIG. 19 is a cross-sectional view of a semiconductor device in the step of depositing silicon nitride according to another manufacturing process with respect to the relief of the stress applied to the first embodiment.
Figure 20:
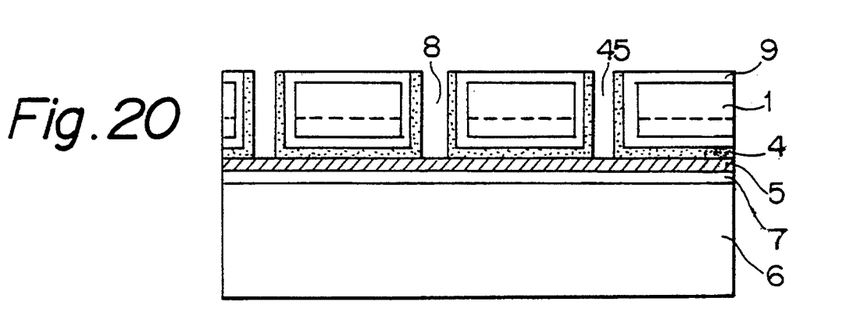
FIG. 20 is a cross-sectional view of a semiconductor device in the etching step according to another manufacturing process with respect to the relief of the stress applied to the first embodiment.
Figure 21:
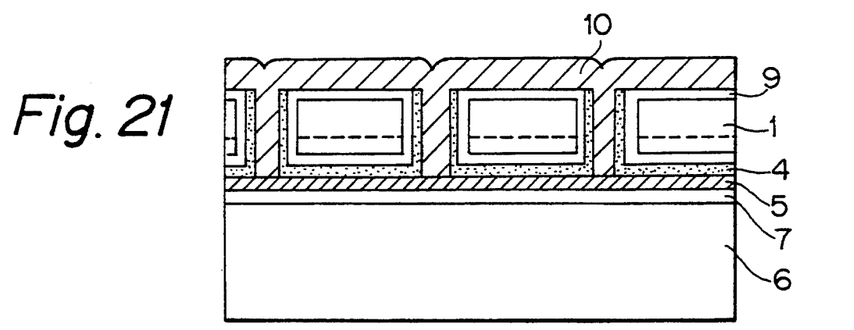
FIG. 21 is a cross-sectional view of a semiconductor device in the step of depositing polysilicon according to another manufacturing process with respect to the relief of the stress applied to the first embodiment.

FIGS. 19 to 21 are cross-sectional views of a semiconductor device shown in the order of the steps of producing the semiconductor. This process is conducted between the step of the thermal oxidation treatment and the step of removing silicon nitride.

Step of Depositing Silicon Nitride (FIG. 19)

An Si₃N₄ layer 45 is deposited by the LPCVD process on the semiconductor device having a cross section as shown in FIG. 5 subjected to the step of the thermal oxidation treatment, and thus a structure having a cross section as shown in FIG. 19 is obtained.

Step of Etching (FIG. 20)

Then, the Si₃N₄ layer 45 deposited on the oxide film 9 by the above-described step and the Si₃N₄ layer 4 underlying the trench portion 8 are removed by directional RIE (reactive ion etching). In this step, the Si₃N₄ layer deposited on the side of the trench portion 8 is not removed to form a structure having a cross section as shown in FIG. 20 (the step of depositing polysilicon).

Figure 22:
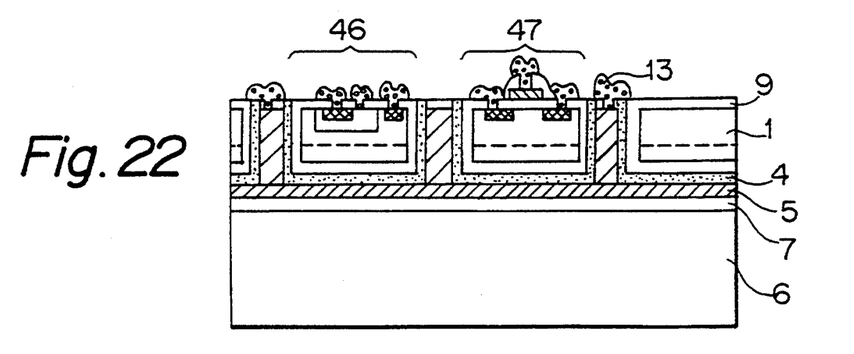
FIG. 22 is a cross-sectional view of a semiconductor device formed according to another manufacturing process with respect to the relief of the stress.

Steps of Depositing Polysilicon (FIG. 21), Leveling and Forming Element (FIG. 22)

Subsequently, a poly-Si layer 10 is deposited by the LPCVD process to form a structure having a cross section as shown in FIG. 21. Thereafter, the structure is subjected to the leveling step and the step of forming an element, to form a structure having a cross section as shown in FIG. 22. In the step of forming an element, a bipolar transistor 46 and an MOS transistor 47 are formed.

Thus, in the above-described steps, since the stress of the oxide film ($SiO_2$ film) formed on the side of the trench portion is also relieved, it is possible to form a semiconductor device wherein the stress relief is further taken into consideration.

It is apparent, however, that the stress can be sufficiently relieved by the manufacturing procedure described above in connection with each embodiment, without the use of the above-described process.

Since there is a general tendency towards a reduction in the film thickness and an increase in the integration density, the film thickness in the element forming region is thin. Therefore, in portions where the $SiO_2$ film is formed, the area of the $SiO_2$ film formed on the $Si_3N_4$ film is considerably larger than the area of the $SiO_2$ film formed around the poly-Si layer so that, as described in the above embodiments, the stress can be sufficiently relieved by forming the $Si_3N_4$ film under the $SiO_2$ film having the largest area.

It is of course understood that the present invention also can be effectively applied to an SOI-type semiconductor device not provided with an electric shielding layer disposed around an insulating film surrounding a region in which a semiconductor element is formed.

We claim:

1. A semiconductor device comprising:
   a substrate;
   a polycrystalline film disposed at least on said substrate;
   adjacent polycrystalline layers disposed on said polycrystalline film and making contact with said polycrystalline film;
   a stress relief film formed on said polycrystalline film, except at a portion where said adjacent polycrystalline layers are formed, said stress relief film formed of a first material;
   an insulating film formed of a second material and disposed adjacent a surface portion of said stress relief film and adjacent an inside surface portion of said adjacent polycrystalline layers, wherein said second material of said insulating film is different from said first material of said stress relief film so that said stress relief film relieves a thermal stress of said insulating film;
   an element forming layer disposed on said insulating film and adjacent said inside surface portion of said adjacent polycrystalline layers such that said adjacent polycrystalline layers form a surrounding region which functions as an electric shielding layer when a potential is applied thereto, said element forming layer including a semiconductor element formed therein; and
   an electrode coupled to at least one of said adjacent polycrystalline layers for applying a potential to said surrounding region.

2. A semiconductor device as in claim 1, wherein said stress relief film forms means for generating a stress acting in an inverse direction with respect to said thermal stress generated by said insulating film.

3. A semiconductor device comprising:
   a substrate;
   a first monocrystalline semiconductor layer formed on said substrate;
   an electrode layer formed under said substrate;
   a second monocrystalline semiconductor layer formed on a first portion of said first monocrystalline semiconductor layer and in which second monocrystalline semiconductor layer there is formed a power device;
   a first insulating film formed on said first monocrystalline semiconductor layer on a second portion thereof;
   a polycrystalline film formed on said first insulating film, an end face thereof nearest said second monocrystalline semiconductor layer being separated therewith by an oxide film material;
   an element forming layer formed on said polycrystalline film, said element forming layer including a semiconductor element formed therein;
   adjacent polycrystalline layers formed extending on opposite sides of said element forming layer and from a main surface thereof down to said polycrystalline film, said adjacent polycrystalline layers making contact with said polycrystalline film to form a surrounding region which function is that of an electric shielding layer when a potential is applied thereto;
   a first stress relief film formed on said polycrystalline film, except at a portion where said polycrystalline layers are formed;
   a second insulating film formed adjacent an inside surface portion of said adjacent polycrystalline layers and
   an electrode portion coupled to at least one of said adjacent polycrystalline layers for applying a potential to said surrounding region.

4. A semiconductor device according to claim 3, further comprising a second stress relief film disposed between at least one of said adjacent polycrystalline layers and a portion of said second insulating film formed adjacent an inside surface portion of said adjacent polycrystalline layers, said second stress relief film contacting said first stress relief film.

5. A semiconductor device according to claim 4, wherein said stress relief film and said second stress relief film are nitride layers and said second insulating film is an oxide film.

6. A semiconductor device comprising:
   a stress relief film;
   an insulating film disposed on said stress relief film; and
   a semiconductor element-forming region disposed on said insulating film and isolated by said insulating film, said element-forming region including a semiconductor element formed therein,
   said stress relief film being formed of a material different than a material of said insulating film, and relieving a thermal stress of said insulating film acting on said semiconductor element-forming region having said semiconductor element formed therein, said stress relief film contacting said insulating film at a portion located below said element-forming region.

7. A semiconductor device according to claim 6, wherein said insulating film is an oxide film.

8. A semiconductor device as in claim 6, wherein said stress relief film forms means for generating a stress acting in an inverse direction with respect to said thermal stress generated by said insulating film.

9. A semiconductor device comprising:
a substrate;
a polycrystalline film formed at least on said substrate;
an element forming layer formed on said polycrystalline film, said element forming layer including a semiconductor element formed therein;
adjacent polycrystalline layers formed extending on opposite sides of said element forming layer and from a main surface thereof down to said polycrystalline film, said adjacent polycrystalline layers making contact with said polycrystalline film to form a surrounding region which function is that of an electric shielding layer when a potential is applied thereto;
an insulating film formed of a first material and formed adjacent an inside surface portion of said adjacent polycrystalline layers as well as adjacent a surface portion of said stress relief film;
a first stress relief film formed on said polycrystalline film, except at a portion where said polycrystalline layers are formed, said first stress relief film formed of a second material different from said first material of said insulating film, and thereby relieving a thermal stress of said insulating film;
an electrode coupled to at least one of said adjacent polycrystalline layers for applying a potential to said surrounding region; and
a second stress relief film disposed between at least one of said adjacent polycrystalline layers and a portion of said insulating film formed adjacent an inside surface portion of said adjacent polycrystalline layers, said second stress relief film contacting said first stress relief film.

10. A semiconductor device comprising:
an electric shielding layer;
a stress relief film disposed on said electric shielding layer;
an insulating film disposed on said stress relief film; and
a semiconductor element-forming region disposed on said insulating film and isolated by said insulating film;
said electric shielding layer shielding said semiconductor element-forming region, and
said stress relief film being formed of a material different from a material of said insulating film for relieving a thermal stress of said insulating film.

11. A semiconductor device as in claim 10, wherein said stress relief film forms means for generating a stress acting in an inverse direction with respect to said thermal stress generated by said insulating film.

12. A semiconductor device comprising:
an insulating film formed of an oxide film;
a semiconductor element-forming region isolated by said insulating film, said element-forming region including a semiconductor element formed therein; and
a stress relief film for relieving a thermal stress of said insulating film acting on said semiconductor element-forming region having said semiconductor element formed therein, said stress relief film contacting said insulating film at a portion located below said element-forming region, wherein said stress relief film is a nitride film, said oxide film separating said nitride film and said element-forming region at the portion located below said element-forming region.

* * * * *